United States Patent
Kataoka et al.

(10) Patent No.: US 10,803,243 B2
(45) Date of Patent: Oct. 13, 2020

(54) METHOD, DEVICE, AND MEDIUM FOR RESTORING TEXT USING INDEX WHICH ASSOCIATES CODED TEXT AND POSITIONS THEREOF IN TEXT DATA

(71) Applicant: FUJITSU LIMITED, Kawasaki-shi, Kanagawa (JP)

(72) Inventors: Masahiro Kataoka, Kamakura (JP); Takahiro Okubo, Yokohama (JP); Ryo Matsumura, Numazu (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/351,925

(22) Filed: Mar. 13, 2019

(65) Prior Publication Data
US 2019/0303436 A1    Oct. 3, 2019

(30) Foreign Application Priority Data
Apr. 2, 2018    (JP) .................................. 2018-071191

(51) Int. Cl.
*G06F 40/268*    (2020.01)
*H03M 7/30*    (2006.01)
*G06F 40/123*    (2020.01)

(52) U.S. Cl.
CPC .......... *G06F 40/268* (2020.01); *G06F 40/123* (2020.01); *H03M 7/6011* (2013.01)

(58) Field of Classification Search
None
See application file for complete search history.

(56) References Cited

U.S. PATENT DOCUMENTS

| 7,917,737 | B2 * | 3/2011 | Bacon ................. G06F 9/30043 712/221 |
| 2009/0089256 | A1 * | 4/2009 | Transier .................. G06F 16/31 |
| 2009/0164437 | A1 * | 6/2009 | Torbjornsen .......... G06F 16/319 |
| 2012/0023073 | A1 * | 1/2012 | Dean ...................... G06F 16/355 707/693 |
| 2015/0331847 | A1 * | 11/2015 | Jung ....................... G06F 40/20 707/739 |
| 2016/0056839 | A1 * | 2/2016 | Kataoka ................... H03M 7/30 341/87 |
| 2016/0171031 | A1 * | 6/2016 | Kataoka .............. G06F 16/2272 707/741 |
| 2016/0217111 | A1 * | 7/2016 | Kataoka ................ G06F 40/157 |

FOREIGN PATENT DOCUMENTS

| JP | 2004-102430 A | 4/2004 |
| JP | 2009-271794 A | 11/2009 |
| JP | 2010-146273 A | 7/2010 |
| JP | 2016-046602 A | 4/2016 |

* cited by examiner

*Primary Examiner* — Howard Cortes
(74) *Attorney, Agent, or Firm* — Westerman, Hattori, Daniels & Adrian, LLP

(57) ABSTRACT

A non-transitory computer-readable recording medium stores therein a data generation program that causes a computer to execute a program including: arranging a first morpheme in an order of a position of the first morpheme in text data by referring to an index generated by the text data, in which positions of a plurality of morphemes included in the text data are associated with each of the morphemes; and referring to relationship information indicating a relationship between morphemes, and when the first morpheme is a specific type having a relationship with a second morpheme, arranging the second morpheme in an order of a position of the second morpheme in the text data by referring to the index.

5 Claims, 16 Drawing Sheets

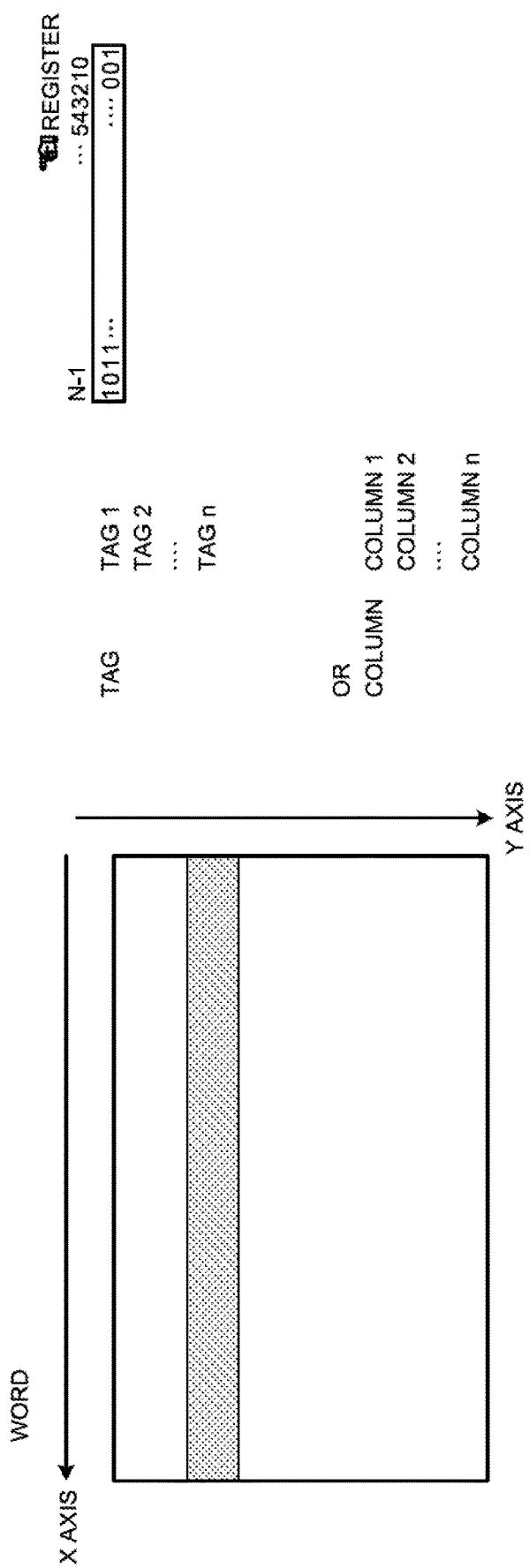

FIG.5

| | 0*h | 1*h | 2*h | 3*h | 4*h | 5*h | 6*h | 7*h |
|---|---|---|---|---|---|---|---|---|
| *0h | NUL | DLE | | | | | HIGH FRE-QUENCY WORDS | HIGH FRE-QUENCY WORDS |
| *1h | SOH | DC1 | | | | | | |
| *2h | STX | DC2 | | | | | | |
| *3h | ETX | DC3 | | | | | | |
| *4h | EOT | DC4 | | | | | | |
| *5h | ENQ | NAK | | | | | | |
| *6h | ACK | SYN | | | | | | |
| *7h | BEL | ETB | | | | | | |
| *8h | BS | CAN | | | | | | |
| *9h | HT | EM | | | | | | |
| *Ah | LF/NL | SUB/EOF | | | | | | |
| *Bh | VT | ESC | | | | | | |
| *Ch | FF/NP | FS | | | | | | |
| *Dh | CR | GS | | | | | | |
| *Eh | SO | RS | | | | | | |
| *Fh | SI | US | | | | | | |

CONTROL CODES (1 BYTE) | SUPER-HIGH FREQUENCY WORDS (ENGLISH) (1 BYTE: 32 WORDS) | SUPER-HIGH FREQUENCY WORDS (JAPANESE) (1 BYTE: 32 WORDS) | HIGH FREQUENCY WORDS (ENGLISH) (2 BYTES: 8k WORDS)

| | 8*h | 9*h | A*h | B*h | C*h | D*h | E*h | F*h |
|---|---|---|---|---|---|---|---|---|
| *0h | HIGH FRE-QUENCY WORDS | HIGH FRE-QUENCY WORDS | LOW FRE-QUENCY WORDS (DYNAMIC AND COMMON) 2 BYTES | LOW FRE-QUENCY WORDS (DYNAMIC AND COMMON) | LOW FRE-QUENCY WORDS (DYNAMIC AND COMMON) | LOW FRE-QUENCY WORDS (DYNAMIC AND COMMON) | LOW FRE-QUENCY WORDS (DYNAMIC AND COMMON) | LOW FRE-QUENCY WORDS (DYNAMIC AND INDE-PENDENT) |
| *1h | | | | | | | | |
| *2h | | | | | | | | |
| *3h | | | | | | | | |
| *4h | | | | | | | | |
| *5h | | | | | | | | |
| *6h | | | | | | | | |
| *7h | | | | | | | | |
| *8h | | | | | | | | |
| *9h | | | | | | | | |
| *Ah | | | | | | | | |
| *Bh | | | | | | | | |
| *Ch | | | | | | | | |
| *Dh | | | | | | | | |
| *Eh | | | | | | | | |
| *Fh | | | | | | | | |

HIGH FREQUENCY WORDS (JAPANESE) (2 BYTES: 8k WORDS) | LOW FREQUENCY WORDS (DYNAMIC CODES) (2 BYTES: 16k WORDS) | LOW FREQUENCY WORDS (DYNAMIC CODES) (3 BYTES: 2M WORDS)

FIG.6

| TAG \ WORD | WORD 1 | WORD 2 | ... |
|---|---|---|---|
| TAG a | 1 | 0 | ... |
| TAG b | 0 | 0 | ... |
| TAG c | 0 | 1 | ... |
| ... | ... | ... | ... |

(1) RESTORATION OF BITMAP OF "HATSU"

| HATSU | 39 | 38 | 37 | 36 | 35 | 34 | 33 | 32 | 31 | 30 | 29 | 28 | 27 | 26 | 25 | 24 | 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|---|---|---|---|---|---|---|---|---|---|---|---|---|---|---|---|---|
|  | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 1 | 0 | 0 | 0 | 0 | 0 | 0 | 0 |

(2) SHIFT TO LEFT OF BITMAP OF "HATSU"

| HATSU | 39 | 38 | 37 | 36 | 35 | 34 | 33 | 32 | 31 | 30 | 29 | 28 | 27 | 26 | 25 | 24 | 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|---|---|---|---|---|---|---|---|---|---|---|---|---|---|---|---|---|
|  | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 1 | 0 | 0 | 0 | 0 | 0 | 0 | 0 | 0 |

(3) RESTORATION OF BITMAP OF "NETSU"

| NETSU | 39 | 38 | 37 | 36 | 35 | 34 | 33 | 32 | 31 | 30 | 29 | 28 | 27 | 26 | 25 | 24 | 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|---|---|---|---|---|---|---|---|---|---|---|---|---|---|---|---|---|
|  | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 1 | 0 | 0 | 0 | 0 | 0 | 0 | 0 | 0 |

(4) AND OPERATION OF BITMAPS OF "HATSU" AND "NETSU"

| HATSUNETSU | 39 | 38 | 37 | 36 | 35 | 34 | 33 | 32 | 31 | 30 | 29 | 28 | 27 | 26 | 25 | 24 | 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|---|---|---|---|---|---|---|---|---|---|---|---|---|---|---|---|---|
|  | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 1 | 0 | 0 | 0 | 0 | 0 | 0 | 0 | 0 |

FIG.11

CALCULATE SECTION OF TAGS (START TAG TO END TAG) OF FUKUSAYO BY BINARY ADDITION OR SUBTRACTION

| | 39 | 38 | 37 | 36 | 35 | 34 | 33 | 32 | 31 | 30 | 29 | 28 | 27 | 26 | 25 | 24 | 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|---|---|---|---|---|---|---|---|---|---|---|---|---|---|---|---|---|
| <FUKUSAYO> | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 1 | 0 | 0 | 0 | 0 | 0 | 0 |
| </FUKUSAYO> | 0 | 0 | 0 | 0 | 0 | 0 | 0 | 0 | 0 | 0 | 0 | 0 | 0 | 0 | 0 | 0 | 0 | 0 | 1 | 0 | 0 | 0 | 0 | 0 | 0 | 0 | 0 | 0 | 0 | 0 | 0 | 0 | 0 | 0 | 0 | 0 | 0 | 0 | 0 | 0 |
| SECTION | 0 | 0 | 0 | 0 | 0 | 0 | 0 | 0 | 0 | 0 | 0 | 0 | 0 | 0 | 0 | 0 | 0 | 0 | 1 | 0 | 0 | 0 | 0 | 0 | 0 | 0 | 0 | 0 | 0 | 0 | 0 | 1 | 1 | 1 | 0 | 0 | 0 | 0 | 0 | 0 |

AND OPERATION OF SECTION AND "HATSUNETSU"

| | 39 | 38 | 37 | 36 | 35 | 34 | 33 | 32 | 31 | 30 | 29 | 28 | 27 | 26 | 25 | 24 | 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|---|---|---|---|---|---|---|---|---|---|---|---|---|---|---|---|---|
| HATSUNETSU | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 1 | 0 | 0 | 0 | 0 | 0 | 0 | 0 | 0 |
| RESULT | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 1 | 0 | 0 | 0 | 0 | 0 | 0 | 0 | 0 |

METHOD, DEVICE, AND MEDIUM FOR RESTORING TEXT USING INDEX WHICH ASSOCIATES CODED TEXT AND POSITIONS THEREOF IN TEXT DATA

CROSS-REFERENCE TO RELATED APPLICATION

This application is based upon and claims the benefit of priority of the prior Japanese Patent Application No. 2018-071191, filed on Apr. 2, 2018, the entire contents of which are incorporated herein by reference.

FIELD

The embodiments discussed herein are related to a data generation method, an information processing device, and a computer-readable recording medium.

BACKGROUND

In data compression and decompression, in file formats such as LZ77 and ZIP, encoding and decoding are performed by allocating a code having a short bit length with respect to characters or a longest match character string. In website search, there has been known a technique of utilizing a transposition index associated with words to accelerate full text search.

Meanwhile, in recent years, there has been known a technique that encoding and decoding are performed by allocating a code to a word in order to perform compression and decompression, and a transposition index associated with a word and an appearance position thereof is generated and incorporated in order to accelerate searching.

Patent Document 1: Japanese Laid-open Patent Publication No. 2016-046602

SUMMARY

According to an aspect of an embodiment, a non-transitory computer-readable recording medium stores therein a data generation program that causes a computer to execute a program including: arranging a first morpheme in an order of a position of the first morpheme in text data by referring to an index generated by the text data, in which positions of a plurality of morphemes included in the text data are associated with each of the morphemes; and referring to relationship information indicating a relationship between morphemes, and when the first morpheme is a specific type having a relationship with a second morpheme, arranging the second morpheme in an order of a position of the second morpheme in the text data by referring to the index.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 4 is an explanatory diagram of a co-occurrence bitmap;

FIG. 5 is an explanatory diagram of a static dictionary and a dynamic dictionary;

FIG. 6 is a diagram illustrating an example of information memorized in a co-occurrence information DB;

FIG. 7 is an explanatory diagram of development of a hashed bitmap transposition index;

FIG. 10 is an explanatory diagram of full text search;

FIG. 11 is an explanatory diagram of tag condition search;

DESCRIPTION OF EMBODIMENT(S)

It is easy to restore original data based on a compression code associated with the order of appearance of words. However, transposition indexes are not arranged in the order of appearance of codes of words, but are transposed (re-arranged) in the code order of the codes of word (or character strings constituting a word). Therefore, it takes a long time to restore the original data. Particularly, if it is desired to restore only a specific part of data, it takes a long time to specify the part to be restored and to search the corresponding index.

Further, in order to suppress an increase of the size of transposition indexes, processing such as excluding words with a high appearance frequency from an index target or increasing the information granularity relating to the positions of transposition indexes are performed. Therefore, it is difficult to restore the original data by utilizing transposition indexes.

Preferred embodiments will be explained with reference to accompanying drawings. The present invention is not limited to the embodiments. The respective embodiments can be combined with each other as appropriate within a scope where no contradictions occur among them.

First Embodiment

Overall Configuration

Figure 1:
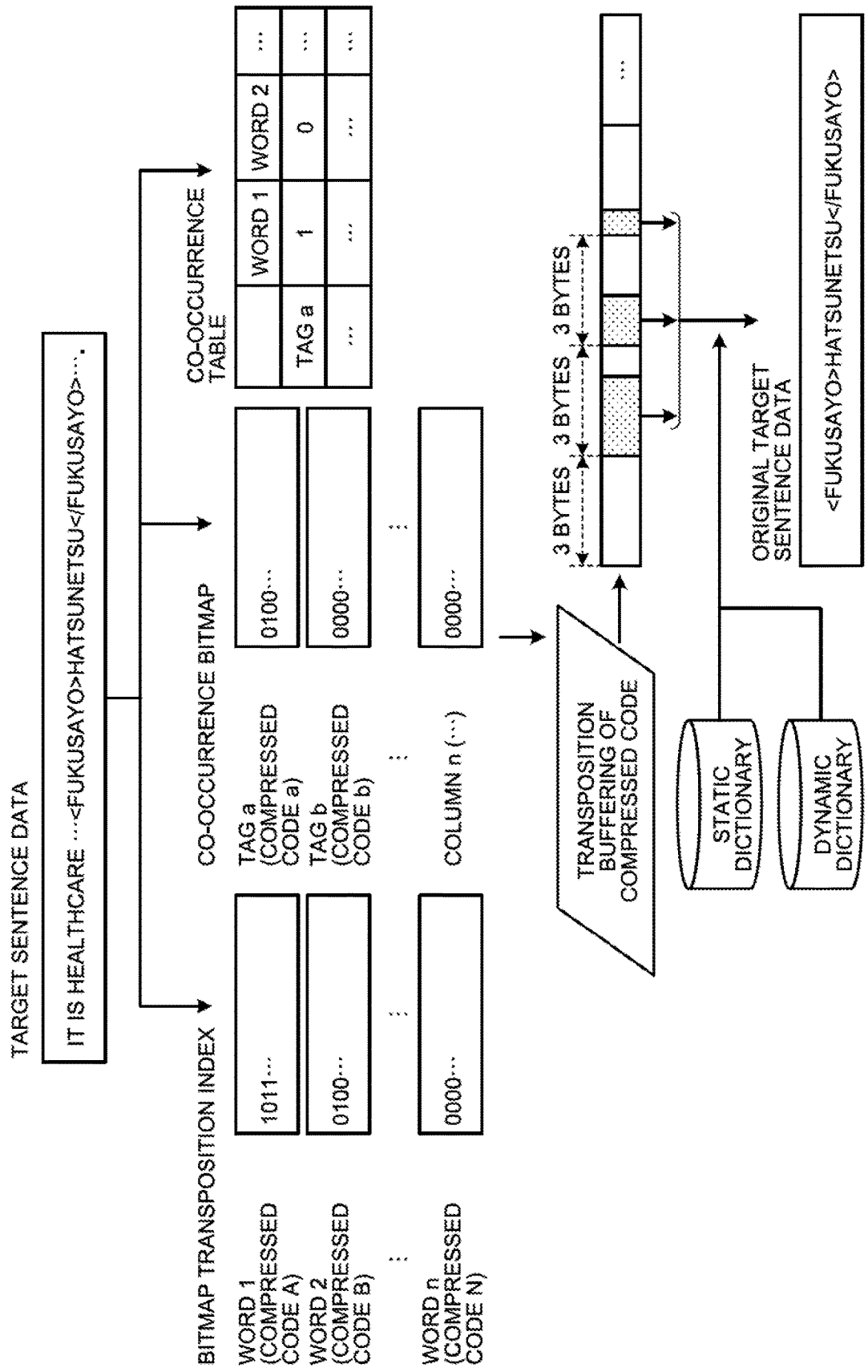
FIG. 1 is an explanatory diagram of a restoration process according to a first embodiment.

First, processes performed by an information processing device 10 (see FIG. 2) according to a first embodiment are described. FIG. 1 is an explanatory diagram of a restoration process according to the first embodiment. Here, a sentence including tagged words such as "healthcare . . . <FUKUSAYO>HATSUNETSU</FUKUSAYO> . . . " is the restoration target. Not only the tags but also columns can be processed in the same manner.

As illustrated in FIG. 1, when target document data is to be encoded, the information processing device 10 generates a bitmap transposition index (hereinafter, it may be described simply as "bitmap" or "hashed bitmap") corresponding to a compression code, as well as a co-occurrence bitmap.

After specifying, by the co-occurrence bitmap, the position of a specified tag and a word to be enclosed with specified tags, the information processing device 10 performs transposition buffering of a compressed code using a bitmap transposition index to arrange a compressed code in a transposition buffer. Thereafter, the information processing device 10 uses a static dictionary and a dynamic dictionary to convert the compressed codes into the transposition buffer in the order of storage to restore only a corresponding part of the original text data.

Here, the bitmap transposition index is an index generated from sentence data to be encoded, and is an index in which a compressed code corresponding to each word appearing in the sentence data is associated with an appearance position in the document data. The co-occurrence bitmap is information in which each tag appearing in the sentence data is associated with a tagged word.

The static dictionary is a dictionary describing a compressed code allocated to a corresponding word in advance for words with a high appearance frequency, and is a table in which words with a high appearance frequency are associated with compressed codes. The dynamic dictionary is a dictionary describing a compressed code allocated to a corresponding word for words with a low appearance frequency, and is a table in which words with a low appearance frequency are associated with compressed codes. That is, the dynamic dictionary memorizes therein an association between a compressed code dynamically allocated to a word when appearing in sentence data and an unregistered word with respect to each unregistered word that is not registered in the static dictionary, among words appearing in the sentence data. Further, the transposition buffer is a buffer sectioned by a fixed length of 3 bytes, and having a length of number of bytes same as a bitmap transposition index. Words in each dictionary include tags.

In such a state, the information processing device 10 acquires each bitmap transposition index corresponding to each of a compression code A, a compression code B, . . . , and a compression code N respectively corresponding to a word 1, a word 2, . . . , and a word n that have appeared in the document data. Similarly, the information processing device 10 acquires a co-occurrence bitmap corresponding to each of the compression code a and the compression code b corresponding to each of a tag a (for example, <FUKUSAYO>) and a tag b that have appeared in the document data. The information processing device 10 further specifies the word 1 enclosed by the tag a to generate the co-occurrence bitmap.

Thereafter, when a word enclosed by the tag a (for example, <FUKUSAYO>) is set as a restoration target by a query from a user or the like, the information processing device 10 decides the search target as the tag a (for example, <FUKUSAYO>) and the tag b being paired therewith (for example, </FUKUSAYO?>). The relationship of the tags can be associated with each other in advance, or can be generated automatically by using a general tag configuration, so as to add "/(slash)" to the tag specified as a search target.

The information processing device 10 then specifies a word 1 (for example, HATSU) and a word 2 (for example, NETSU) corresponding to the tag a (FUKUSAYO) by referring to the co-occurrence bitmap, and narrows down the word 1 and the word 2 as transposition targets and restoration targets. Subsequently, the information processing device 10 acquires the bitmap transposition index corresponding to each of the word 1 and the word 2, and acquires the co-occurrence bitmap corresponding to each of the tag a <FUKUSAYO> and the tag b </FUKUSAYO>. The information processing device 10 then prepares a transposition buffer sectioned by 3 bytes each.

The information processing device 10 then specifies the position of the tag a <FUKUSAYO> in the original data according to the co-occurrence bitmap corresponding to the tag a <FUKUSAYO>, and specifies the position of the tag b </FUKUSAYO> in the original data according to the co-occurrence bitmap corresponding to the tag b </FUKUSAYO>. Similarly, the information processing device 10 specifies the positions of the word 1 and the word 2 in the original data according to the bitmap transposition index corresponding to the word 1. In this manner, the information processing device 10 specifies bits 6, 7, 8, and 9 as appearance positions of a character "HATSU" and a character "NETSU" that are enclosed by the tags <FUKUSAYO> in the original data.

Subsequently, the information processing device 10 transposes compression codes of the appeared word 1 (HATSU), word 2 (NETSU), tag a (<FUKUSAYO>), and tag b (</FUKUSAYO>) in the transposition buffer corresponding to the appearance positions in the target sentence data. For example, when the tag a <FUKUSAYO> (the compression code a) appears in the sixth place, the tag b </FUKUSAYO> (the compression code b) appears in the ninth place, the word 1 (the compression code A) appears in the seventh place, and the word 2 (the compression code B) appears in the eighth place, the information processing device 10 stores the compression code a in the sixth place, the compression code A in the seventh place, the compression code B in the eighth place, and the compression code b in the ninth place in the transposition buffer.

Thereafter, the information processing device 10 converts the respective stored compression codes into the original words in the order stored in the transposition buffer, by referring to the static dictionary and the dynamic dictionary. As it is explained with reference to the case described above, the information processing device 10 converts the compression code a stored in the sixth place of the transposition buffer into the tag <FUKUSAYO>, converts the compression code A stored in the seventh place thereof into the word 1, converts the compression code B stored in the eighth place thereof into the word 2, and converts the compression code b stored in the ninth place thereof into the tag </FUKUSAYO>. By arranging these elements in the order of storage, as "<FUKUSAYO>, HATSU, NETSU, </FUKUSAYO>, only the part to be searched in the original sentence data can be restored.

In this manner, the information processing device 10 arranges corresponding words associated with the index in the order of positions in the document data, by referring to the index generated from the document data as text data, in which each of the words and tags included in the document data are associated with positions in the document data. Therefore, the information processing device 10 can generate a part of the original data based on the bitmap transposition index and the like. In the present embodiment, a bitmap transposition index corresponding to a compression code of a word is explained as an example. However, the present invention is not limited thereto, and even a bitmap transposition index corresponding to a morpheme acquired from document data or a word itself can be processed in the same manner. In this case, before storage in the transposition buffer, the morpheme or the word is converted into a compression code by using the static dictionary and the dynamic dictionary.

Functional Configuration

Figure 2:
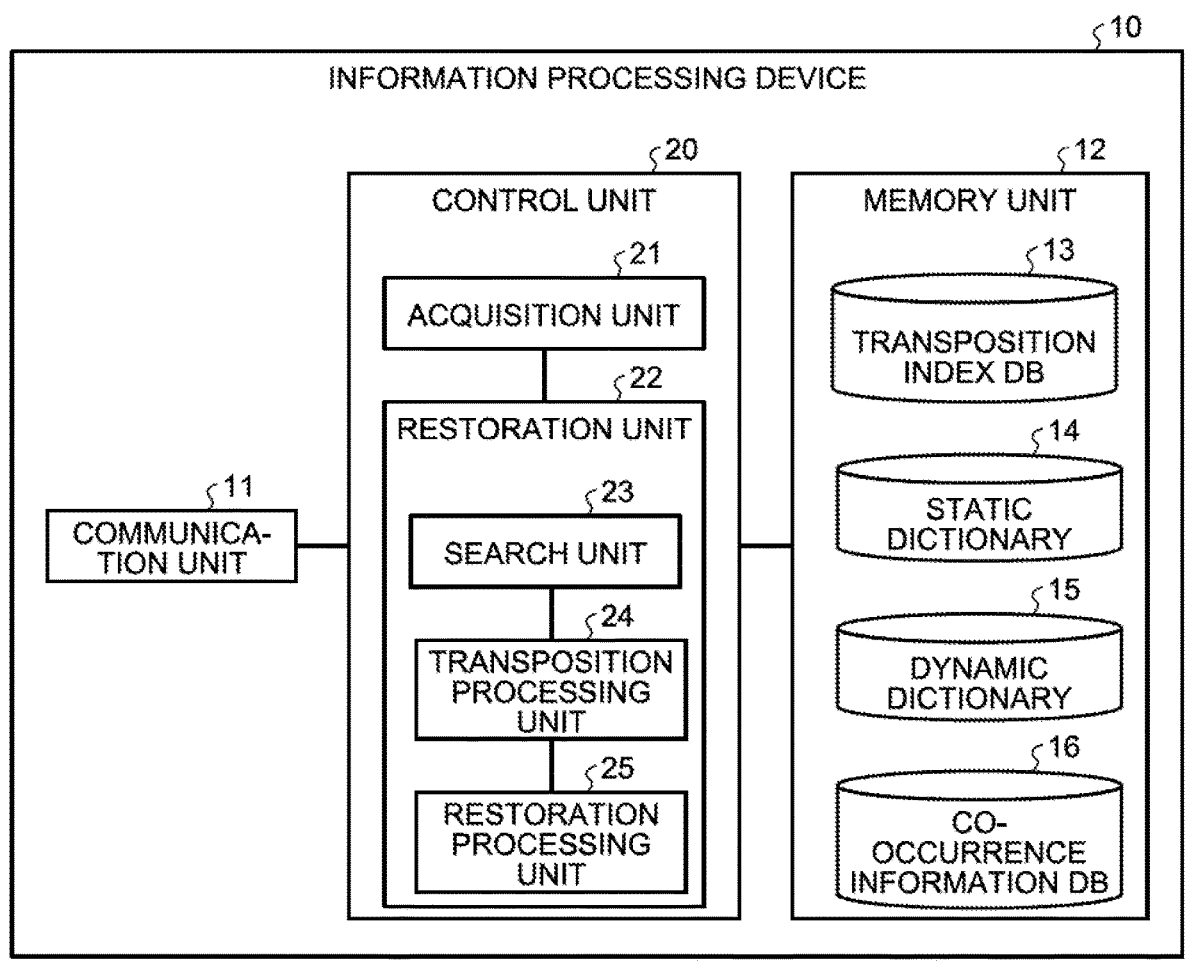
FIG. 2 is a functional block diagram illustrating a functional configuration of an information processing device according to the first embodiment.

FIG. 2 is a functional block diagram illustrating a functional configuration of the information processing device 10 according to the first embodiment. As illustrated in FIG. 2, the information processing device 10 includes a communication unit 11, a memory unit 12, and a control unit 20.

The communication unit 11 is a processing unit that controls communication with other devices and is, for example, a network interface card. For example, the communication unit 11 receives a bitmap transposition index and the like from other information processing devices 10.

The memory unit 12 is an example of a memory device that memorizes therein programs and data and is, for example, a memory or a hard disk. The memory unit 12 memorizes therein a transposition index DB 13, a static dictionary 14, a dynamic dictionary 15, a co-occurrence information DB 16, and the like.

The transposition index DB 13 is an index generated from sentence data to be encoded, and is a database that memorizes therein bitmap transposition indexes with offsets in which a compression code corresponding to each word appearing in the sentence data is associated with an appearance position in the document data.

Figure 3:
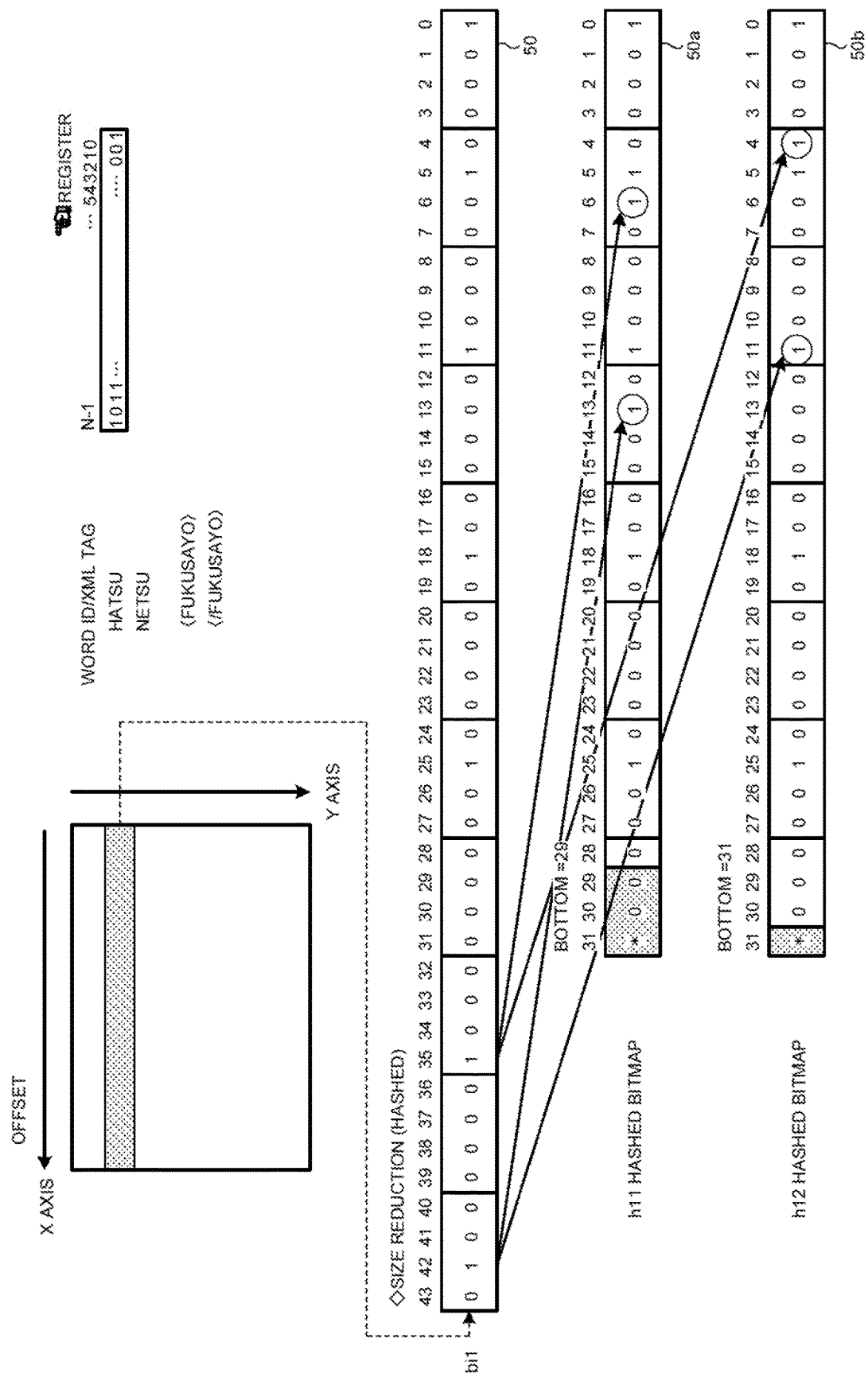
FIG. 3 is an explanatory diagram of size reduction relating to a bitmap transposition index.

A generation example of the bitmap transposition index with offsets is described with reference to FIG. 3. FIG. 3 is an explanatory diagram of size reduction relating to a bitmap transposition index. While an example in which a device that generates a bitmap transposition index is an index generation device different from the information processing device 10 is described here, the information processing device 10 can generate the bitmap transposition index.

A generation example of the bitmap transposition index with offsets is described with reference to FIG. 3. As illustrated in FIG. 3, a generation process of the bitmap transposition index with offsets generates a hashed index from a bitmap index to realize size reduction of a bitmap index. That is, the bitmap transposition index generates a hashed index to which hashing is applied two-dimensionally (a word axis and a file axis), based on a plurality of hash values (bottom) that are adjacent to each other.

The bitmap index referred to herein is a bitmap in which the presence of a word included in text data for each file is indexed. As illustrated in FIG. 3, the offset is plotted on an X axis of the bitmap index and a word ID is plotted on a Y axis of the bitmap index. That is, the bitmap index represents the presence of a word indicated by a word ID in a certain file. As an example, a bitmap bi1 corresponding to a certain word ID is illustrated. If the word indicated by the certain word ID is present in a file, a binary number "1" is set as the presence of the word in the file, and if the word is not present in the file, a binary number "0" is set as the presence of the word in the file.

For example, as illustrated in FIG. 3, the index generation device generates a plurality of hashed bitmaps to which a hash function is applied with respect to each bitmap corresponding to a word ID. It is assumed here that the index generation apparatus is a 32-bit register, and as an example, the index generation apparatus hashes each bitmap based on hash values (bottom) of 29 and 31. Specifically, with respect to the hashed bitmap of one bottom, the index generation device sets values of the respective bits of the bitmap to positions of a remainder of division by dividing positions of respective bits of the bitmap corresponding to the word ID by the bottom.

As an example, the index generation device sets values of the respective bits of the bitmap bi1 at the remainder positions of division by dividing positions of the respective bits of the bitmap bi1 by the bottom 29, with respect to the hashed bitmap h11 of the bottom 29. A bit value "1" at the 35th bit position in the bitmap bi1 is set at the sixth bit in the hashed bitmap h11. A bit value "1" at the 42nd bit position in the bitmap bi1 is set at the 13th bit in the hashed bitmap h11. The index generation device sets values of the respective bits of the bitmap bi1 at the remainder positions of division by dividing positions of the respective bits of the bitmap bi1 by the bottom 31, with respect to the hashed bitmap h12 of the bottom 31. A bit value "1" at the 35th bit position in the bitmap bi1 is set at the fourth bit in the hashed bitmap h12. A bit value "1" at the 42nd bit position in the bitmap Bi1 is set at the 11th bit in the hashed bitmap h12. That is, the index generation device sets the respective bits from the 0th bit of the bitmap sequentially from the 0th bit to the (bottom-1)th bit in the hashed bitmap. The index generation device returns again and sets an ORed value from the 0th bit thereafter in the hashed bitmap and a value already set in the hashed bitmap.

More specifically, as an example, there is explained a case where it is assumed that a bitmap 50 is included in an index and the bitmap 50 is hashed. The index generation device generates a bitmap 50a of the bottom 29 and a bitmap 50b of the bottom 31 from the bitmap 50. In the bitmap 50a, a section is set for each offset 29 with respect to the bitmap 50, and an offset with flag "1" starting from the set section is represented by flags of offsets 0 to 28 in the bitmap 50a.

The index generation device copies the information from the offset 0 to the offset 28 of the bitmap 50 to the bitmap 50a. The index generation device processes the offset information on an offset 29 and onwards of the bitmap 50a in the following manner.

A flag "1" is set in an offset "35" of the bitmap 50. Because the offset "35" is an offset "28+7", the index generation device sets a flag "(1)" to an offset "6" of the bitmap 50a. It is assumed that the first offset is 0. A flag "1" is set in an offset "42" of the bitmap 50. Because the offset "42" is an offset "28+14", the index generation device sets a flag "(1)" to an offset "13" of the bitmap 50a.

In the bitmap 50b, a section is set for each offset 31 with respect to the bitmap 50, and an offset with the flag "1" starting from the set section is represented by flags of offsets 0 to 30 in the bitmap 50b.

A flag "1" is set in the offset "35" of the bitmap 50. Because the offset "35" is an offset "30+5", the index generation device sets a flag "(1)" to an offset "4" of the bitmap 50b. It is assumed that the first offset is 0. A flag "1" is set in the offset "42" of the bitmap 50. Because the offset "42" is an offset "30+12", the index generation device sets a flag "(1)" to an offset "11" of the bitmap 50b.

The index generation device generates the bitmaps 50a and 50b from the bitmap 50 by performing the processes described above. The bitmaps 50a and 50b are the results of hashing the bitmap 50. While a case where the length of the bitmap 50 is 0 to 43 has been explained here, even in a case where the length of the bitmap 50 is equal to or more than 43, the flag "1" set in the bitmap 50 can be expressed with the bitmap 50a and the bitmap 50b.

In this manner, the index generation device generates a hashed bitmap generated according to the method described above for each word. Subsequently, the transposition index DB 13 memorizes therein the hashed bitmap for each word. Note that, as described above, a bitmap transposition index having a general size can be used instead of the size-reduced transposition index. As the size reduction method, any known method can be employed.

Further, the transposition index DB 13 memorizes therein a co-occurrence bitmap that is a bitmap transposition index with offsets in which a compression code corresponding to each tag appearing in sentence data is associated with an appearance position in document data, which is an index generated from sentence data to be encoded. FIG. 4 is an explanatory diagram of a co-occurrence bitmap. As illustrated in FIG. 4, the co-occurrence bitmap has a configuration identical to that of the bitmap transposition index with offsets, but it is different from the bitmap transposition index in that it is not an offset but a word. The generation method of the co-occurrence bitmap is identical to that of the bitmap transposition index with offsets, and thus detailed explanations thereof are omitted. Further, the bitmap transposition index and the co-occurrence bitmap may be described collectively as a bitmap transposition index.

The static dictionary 14 is a database or the like that memorizes therein an association between a word having a high appearance frequency and a compression code allocated in advance to the word. The dynamic dictionary 15 is a database that memorizes therein the association between a word having a low appearance frequency, not registered in the static dictionary 14, and appearing in the document data to be encoded and a compression code allocated to the word.

FIG. 5 is an explanatory diagram of the static dictionary 14 and the dynamic dictionary 15. The dictionary illustrated in FIG. 5 is a dictionary formed by combining the static dictionary 14 and the dynamic dictionary 15, in which compression codes are associated in one-to-one correspondence with a Y axis of a bitmap transposition index. Elements from "0*h" to "9*h" on the horizontal axis illustrated in FIG. 5 correspond to the static dictionary 14, and those from "A*h" to "F*h" correspond to the dynamic dictionary 15.

Items in the lateral direction in the upper part of FIG. 5 express the first one byte in a hexadecimal notation from 0 to F, and "*" indicates the second byte. For example, "1*h" indicates that the first byte is "00000001" in a binary notation. Items in the vertical direction on the left express the second byte in the hexadecimal notation from 0 to F, and "*" indicates the first byte. For example, "*2h" indicates that the second byte is "00000010" in the binary notation.

Codes of "0*h" and "1*h" are one-byte codes, and a common control code is associated therewith in each hierarchy. Codes of "2*h" to "3*h" are one-byte codes, and super-high frequency words (English words) having a particularly high appearance frequency among the words appearing highly frequently are associated therewith in advance. Codes of "4*h" and "5*h" are one-byte codes, and super-high frequency words (Japanese words) having a particularly high appearance frequency among the words appearing highly frequently are associated therewith in advance.

Codes of "6*h" and "7*h" are two-byte codes, and words appearing highly frequently (English words) are associated therewith in advance. Codes of "8*h" and "9*h" are two-byte codes, and words appearing highly frequently (Japanese words) are associated therewith in advance. Codes from "A*h" to "F*h" are two-byte or three-byte codes, and when a low frequency word appears, a code is allocated thereto dynamically. "E*h" and "F*h" are three-byte codes to correspond to shortage of codes.

Figure 6:
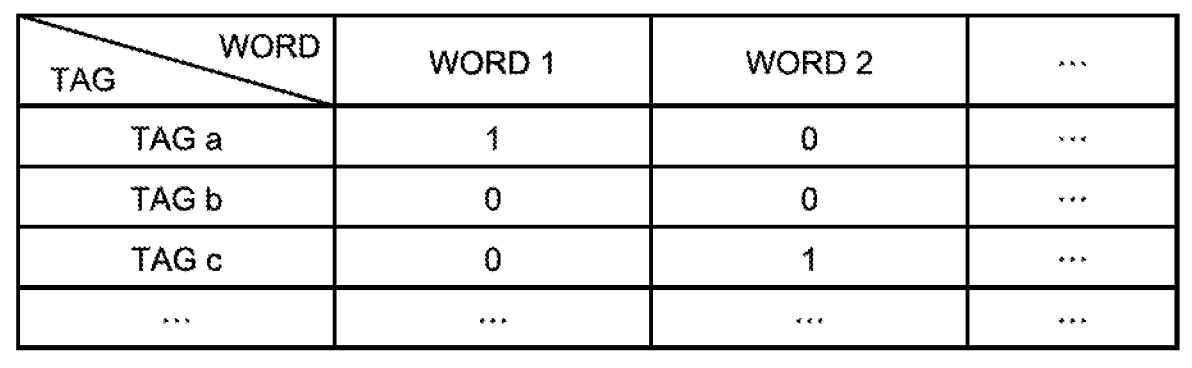

Referring back to FIG. 2, the co-occurrence information DB 16 is a database that memorizes therein a relationship between the tags and words included in sentence data to be encoded. The information memorized in the co-occurrence information DB 16 is generated at the time of encoding. FIG. 6 is a diagram illustrating an example of information memorized in the co-occurrence information DB 16. As illustrated in FIG. 6, the co-occurrence information DB 16 memorizes therein "tags" and "words" in association with each other. In the example of FIG. 6, it is illustrated that a word 1 is enclosed by a tag a and a word 2 is enclosed by a tag c.

The control unit 20 is a processing unit that controls the entire information processing device 10, and is a processor, for example. The control unit 20 executes an acquisition unit 21 and a restoration unit 22. The acquisition unit 21 and the restoration unit 22 are an example of an electronic circuit provided in the processor or an example of processes performed by the processor.

The acquisition unit 21 is a processing unit that acquires a bitmap transposition index with offsets and a co-occurrence bitmap from other computers such as an index generation device. Specifically, the acquisition unit 21 acquires the bitmap transposition index generated by the method described with reference to FIG. 3 and stores the bitmap transposition index in the transposition index DB 13. The acquisition unit 21 also acquires the co-occurrence bitmap generated by the method described with reference to FIG. 3 and stores the co-occurrence bitmap in the transposition index DB 13. The acquisition unit 21 can also generate the bitmap transposition index with offsets and the co-occurrence bitmap.

The restoration unit 22 includes a search unit 23, a transposition processing unit 24, and a restoration processing unit 25, and performs restoration of original document data by using a bitmap transposition index with offsets, a co-occurrence bitmap, and the like. Specifically, after the restoration unit 22 restores a hashed bitmap transposition index and a co-occurrence bitmap, restoration of original document data is performed by using the search unit 23, the transposition processing unit 24, and the restoration processing unit 25. The transposition processing unit 24 and the restoration processing unit 25 are examples of a first arrangement unit and a second arrangement unit.

Figure 7:
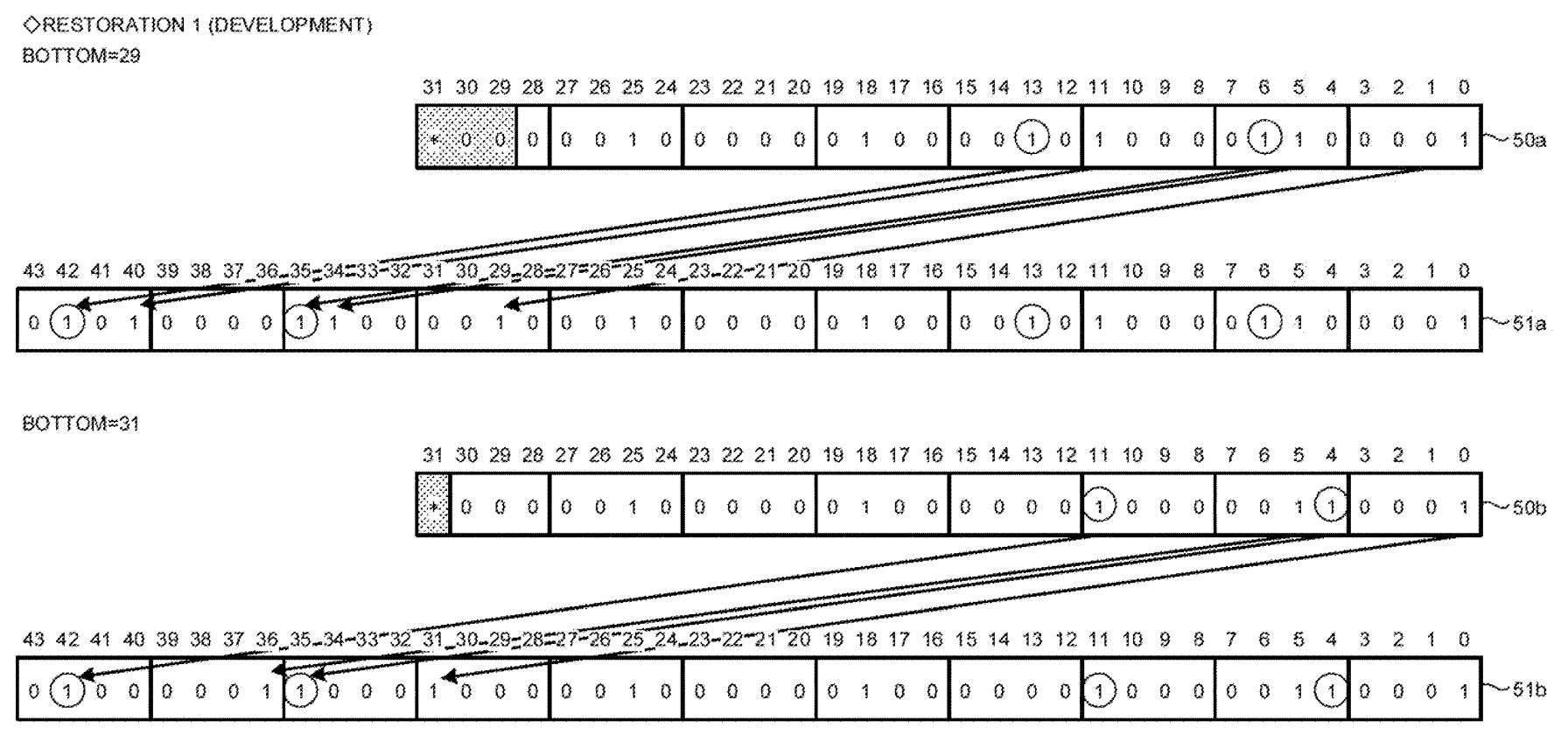
Figure 8:
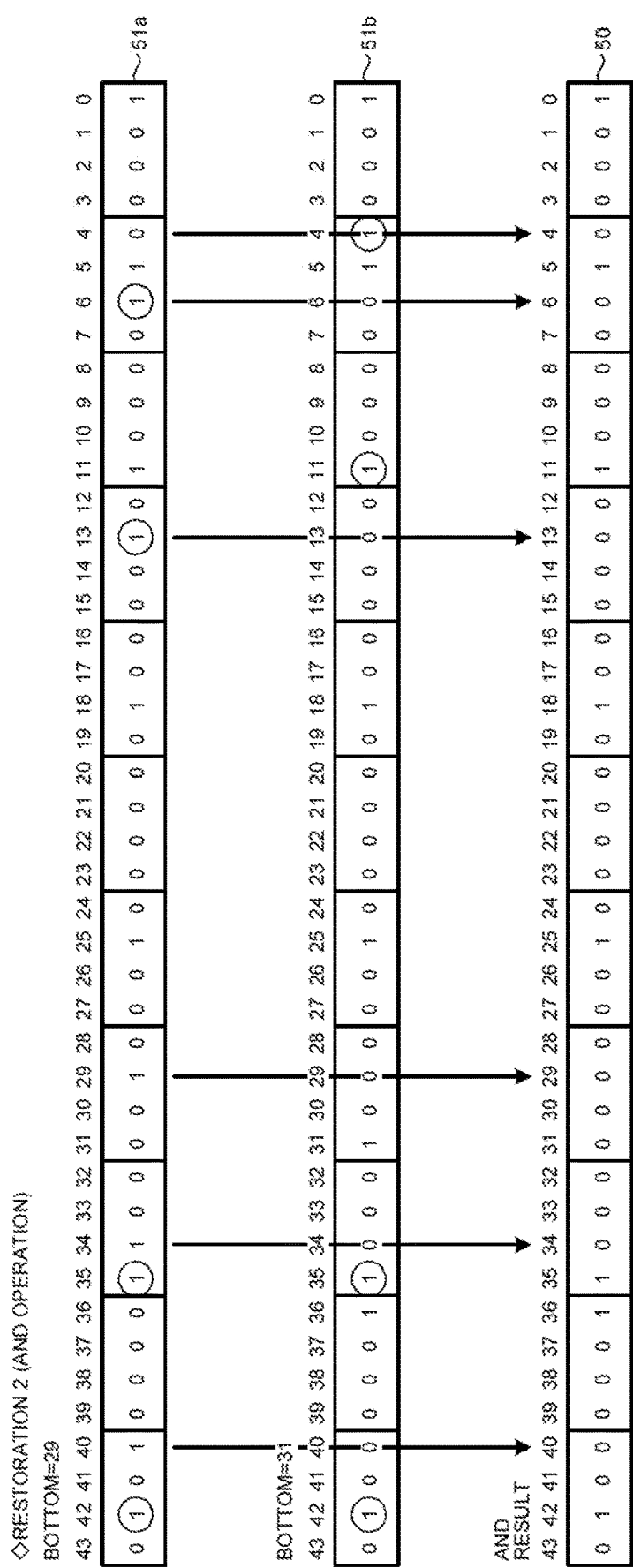
FIG. 8 is an explanatory diagram of an AND operation of a hashed bitmap transposition index.

Restoration of a hashed bitmap transposition index is described with reference to FIG. 7 and FIG. 8. FIG. 7 is an explanatory diagram of development of a hashed bitmap transposition index, and FIG. 8 is an explanatory diagram of an AND operation of a hashed bitmap transposition index. As an example, a process of restoring the bitmap 50 based on the bitmap 50a and the bitmap 50b is explained here. The bitmaps 50, 50a, and 50b correspond to those explained with reference to FIG. 3.

As illustrated in FIG. 7, the restoration unit 22 generates a bitmap 51a based on the bitmap 50a of the bottom 29. Information of flags of offsets 0 to 28 in the bitmap 51a is similar to that of the flags of offsets 0 to 28 in the bitmap 50a. The information of flags of an offset 29 and onwards in the bitmap 51a is repetition of information of offsets 0 to 28 in the bitmap 50a.

Similarly, the restoration unit 22 generates a bitmap 51b based on the bitmap 50b of the bottom 31. Information of flags of offsets 0 to 30 in the bitmap 51b is similar to that of the flags of offsets 0 to 30 in the bitmap 50b. The information of flags of an offset 31 and onwards in the bitmap 51b is repetition of information of offsets 0 to 30 in the bitmap 50b.

Thereafter, as illustrated in FIG. 8, the restoration unit 22 performs an AND operation of the bitmap 51a and the bitmap 51b to generate the bitmap 50. In the example illustrated in FIG. 8, in offsets "0, 5, 11, 18, 25, 35, 42", flags in the bitmap 51a and the bitmap 51b are "1". Therefore, flags of offsets "0, 5, 11, 18, 25, 35, 42" in the bitmap 50 become "1". The bitmap 50 becomes the restored bitmap. The restoration unit 22 restores the respective bitmaps by repeatedly performing the same process with respect to other bitmaps to generate an index.

Figure 9:
FIG. 9 is an explanatory diagram of an index to be restored.

Referring back to FIG. 2, the search unit 23 is a processing unit that searches a search target according to a search query including a tag to be searched or the like. Specifically, after a bitmap transposition index with offsets whose size has been reduced by hashing and a co-occurrence bitmap are restored, the search unit 23 performs full text search by a shift and an AND operation of bitmaps. A searching process performed by the search unit 23 is specifically described with reference to FIG. 9 to FIG. 11. FIG. 9 is an explanatory diagram of an index to be restored. FIG. 10 is an explanatory diagram of full text search. FIG. 11 is an explanatory diagram of tag condition search.

As illustrated in FIG. 9, when "<FUKUSAYO>HATSUNETSU</FUKUSAYO>" is included in the sixth bit to the ninth bit in the original data, "1" has been stored in the seventh bit in the bitmap transposition index after restoration corresponding to "HATSU", and "1" is stored in the eighth bit in the bitmap transposition index after restoration corresponding to "NETSU". Further, "1" has been stored in the sixth bit in the co-occurrence bitmap after restoration corresponding to "<FUKUSAYO>", and "1" is stored in the ninth bit in the co-occurrence bitmap after restoration corresponding to "/<FUKUSAYO>".

As illustrated in FIG. 10, in the searching process performed by the search unit 23, a character string in a corresponding search condition is searched by performing a logical operation of a bitmap included in the bitmap index and a search bitmap generated in association with the order of appearance of respective characters constituting the character string in the search condition. In the searching process performed by the search unit 23, a search character string is received. In this example, the search character string is "HATSUNETSU".

In the searching process, a bitmap corresponding to the first character "HATSU" included in the search character string "HATSUNETSU" is extracted from the bitmap index. "1" is set in the seventh bit of the bitmap. In the searching process, the bitmap is shifted to the left by one bit. Therefore, "1" is set in the eighth bit of the bitmap.

Subsequently, in the searching process, a bitmap corresponding to the subsequent second character "NETSU" included in the search character string "HATSUNETSU" is extracted from the bitmap index. "1" is set in the eighth bit of the bitmap. In the searching process, an AND operation of the shifted bitmap corresponding to the first character "HATSU" and the bitmap corresponding to the subsequent character "NETSU" is performed. The bitmap obtained by performing the AND operation corresponds to a search bitmap generated in association with the order of appearance in "HATSUNETSU" constituting the search character string. In the searching process, it is determined whether all the bits in the bitmap are 0 as a result of operation. In this example, because the eighth bit in the bitmap is calculated as "1", it is determined that it is not said that all the bits are "0". That is, it is determined in the searching process that there is a character string "HATSUNETSU" including the current character and the next character.

Further, in the searching process, a bitmap corresponding to the tag "<FUKUSAYO>" is extracted from the bitmap index, and "1" is set in the sixth bit of the bitmap. Similarly, in the searching process, a bitmap corresponding to the tag "</FUKUSAYO>" is extracted from the bitmap index, and "1" is set in the ninth bit of the bitmap. In the searching process, a bitmap in which "1" is set from the sixth bit to the ninth bit put between a start tag <FUKUSAYO> and an end tag </FUKUSAYO> is generated.

Thereafter, in the searching process, an AND operation of the bitmap in which "1" is set from the sixth bit to the ninth bit corresponding to the tag <FUKUSAYO> generated here and the bitmap corresponding to "HATSUNETSU" described above in which "1" is set in the eighth bit is performed. A bitmap in which "1" is set in the eighth bit is generated in the searching process as a result of the AND operation. In the searching process, it is determined whether all the bits in the bitmap are "0" as the result of operation. In this example, because the eighth bit in the bitmap is calculated as "1", it is determined that it is not said that all the bits are "0". That is, in the searching process, it can be determined that there is a character string "HATSUNETSU" between the tags and the sixth bit to the ninth bit are the restored part corresponding to the search query.

The transposition processing unit 24 is a processing unit that transposes a compression code of a corresponding word and a compression code of a corresponding tag to a transposition buffer based on a bitmap of a bitmap transposition index and a co-occurrence bitmap. The transposition processing unit 24 secures a transposition buffer sectioned by 3 bytes, which is the maximum number of bytes of a code managed in the dynamic dictionary 15, in a memory or the like, and stores the compression codes of the corresponding word and tag in a transposition buffer corresponding to the position at which the word and the tag have appeared.

Figure 12:
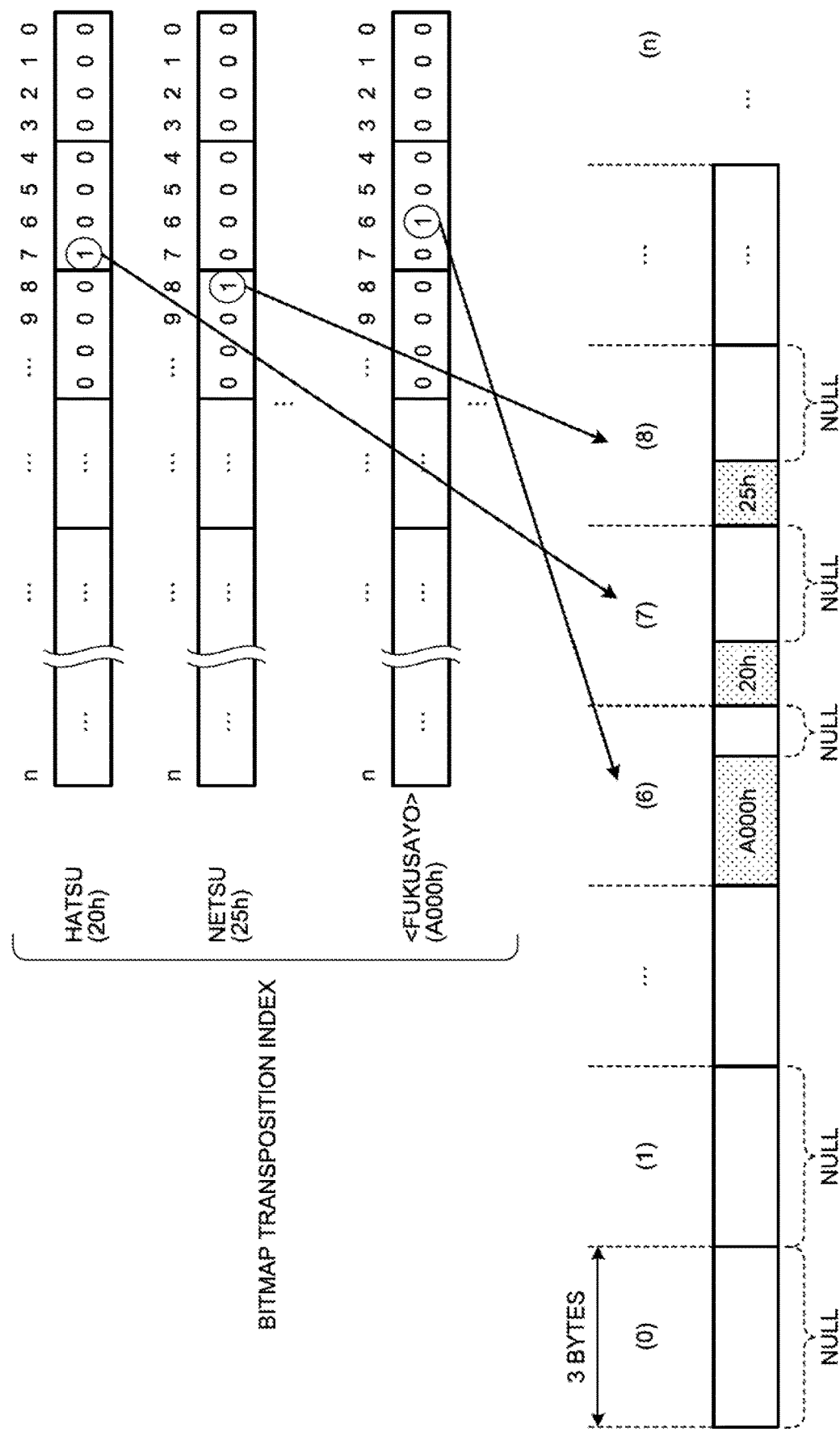
FIG. 12 is an explanatory diagram of transposition of a compression code.

FIG. 12 is an explanatory diagram of transposition of a compression code. For example, as illustrated in FIG. 12, because "1" is stored at the seventh position of the offset (position) of the compression code "20h" corresponding to the word "HATSU", the transposition processing unit 24 stores the compression code "20h" in (7), which is the eighth position in a transposition buffer. In a region where the compression code "20h" is stored, an unused region becomes NULL. Similarly, because "1" is stored at the eighth position of the offset (position) of the compression code "25h" corresponding to the word "NETSU", the transposition processing unit 24 stores the compression code "25h" in (8), which is the ninth position in the transposition buffer. In a region where the compression code "25h" is stored, an unused region becomes NULL. Similarly, because "1" is stored at the sixth position of the offset (position) of a compression code "A000h" corresponding to the tag <FUKUSAYO>, the transposition processing unit 24 stores the compression code "A000h" in (6), which is the seventh position in the transposition buffer. In a region where the compression code "A000h" is stored, an unused region becomes NULL.

In this manner, the transposition processing unit 24 can store the compression codes of the corresponding words and the like in the order of appearance in document data, sequentially from the top of the transposition buffer sectioned by 3 bytes based on the bitmap transposition index of the respective compression codes of the word "HATSU", the word "NETSU", the tag "<FUKUSAYO>", and the tag "/<FUKUSAYO>". The transposition processing unit 24 outputs a transposition buffer in which the compression codes are stored to the restoration processing unit 25.

The restoration processing unit 25 is a processing unit that restores a part to be restored in original document data from a transposition buffer in which compression codes are stored. Specifically, the restoration processing unit 25 deletes NULL in the transposition buffer and generates compressed data in which only the compression codes are extracted. Thereafter, the restoration processing unit 25 performs restoration of the document data by using the static dictionary 14 or the dynamic dictionary 15 to restore the respective compression codes to original words. The restoration processing unit 25 can also restore the state of the transposition buffer by inserting NULL to compressed data.

Figure 13:
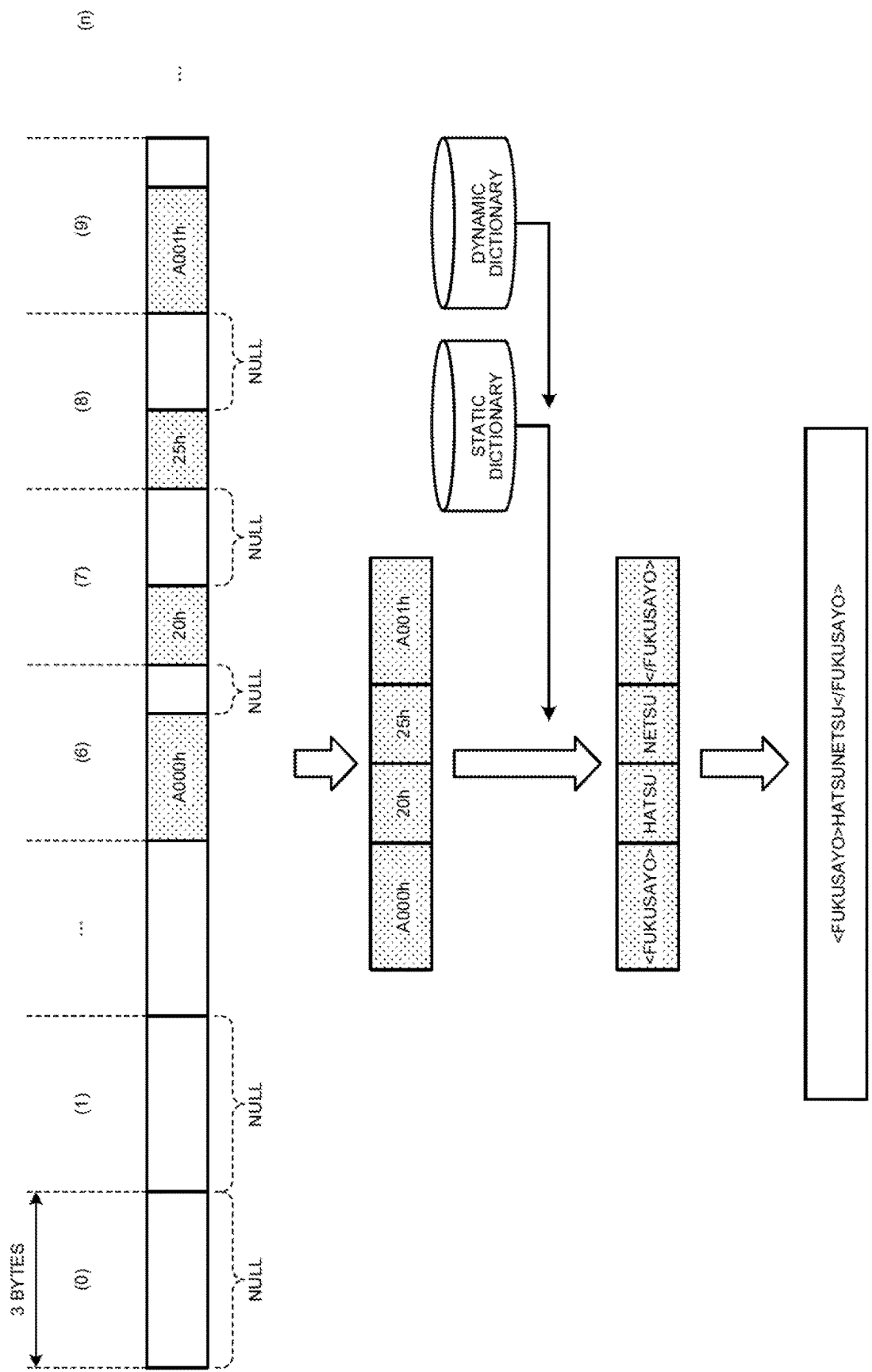
FIG. 13 is an explanatory diagram of generation of compressed data and restoration of original document data.

FIG. 13 is an explanatory diagram of generation of compressed data and restoration of original document data. As illustrated in FIG. 13, the restoration processing unit 25 deletes "NULL" from a (0) buffer being the top of a transposition buffer to a (n) buffer sequentially to extract the compression codes "A000h", "20h", "25h", and "A001h" sequentially. The restoration processing unit 25 then generates compressed data "A000h, 20h, 25h, A001h" in which extracted compression codes are connected to one another.

Thereafter, the restoration processing unit 25 refers to the static dictionary 14 and the dynamic dictionary 15 to specify words and the like corresponding to the respective compression codes in the compressed data "A000h, 20h, 25h, A001h", and generates "<FUKUSAYO>, HATSU, NETSU, </FUKUSAYO>" in which the compressed data is converted into words and the like. The restoration processing unit 25 then connects the words and the like obtained by conversion to restore the restoration target "<FUKUSAYO>HATSUNETSU</FUKUSAYO>".

Process Flow

Figure 14:
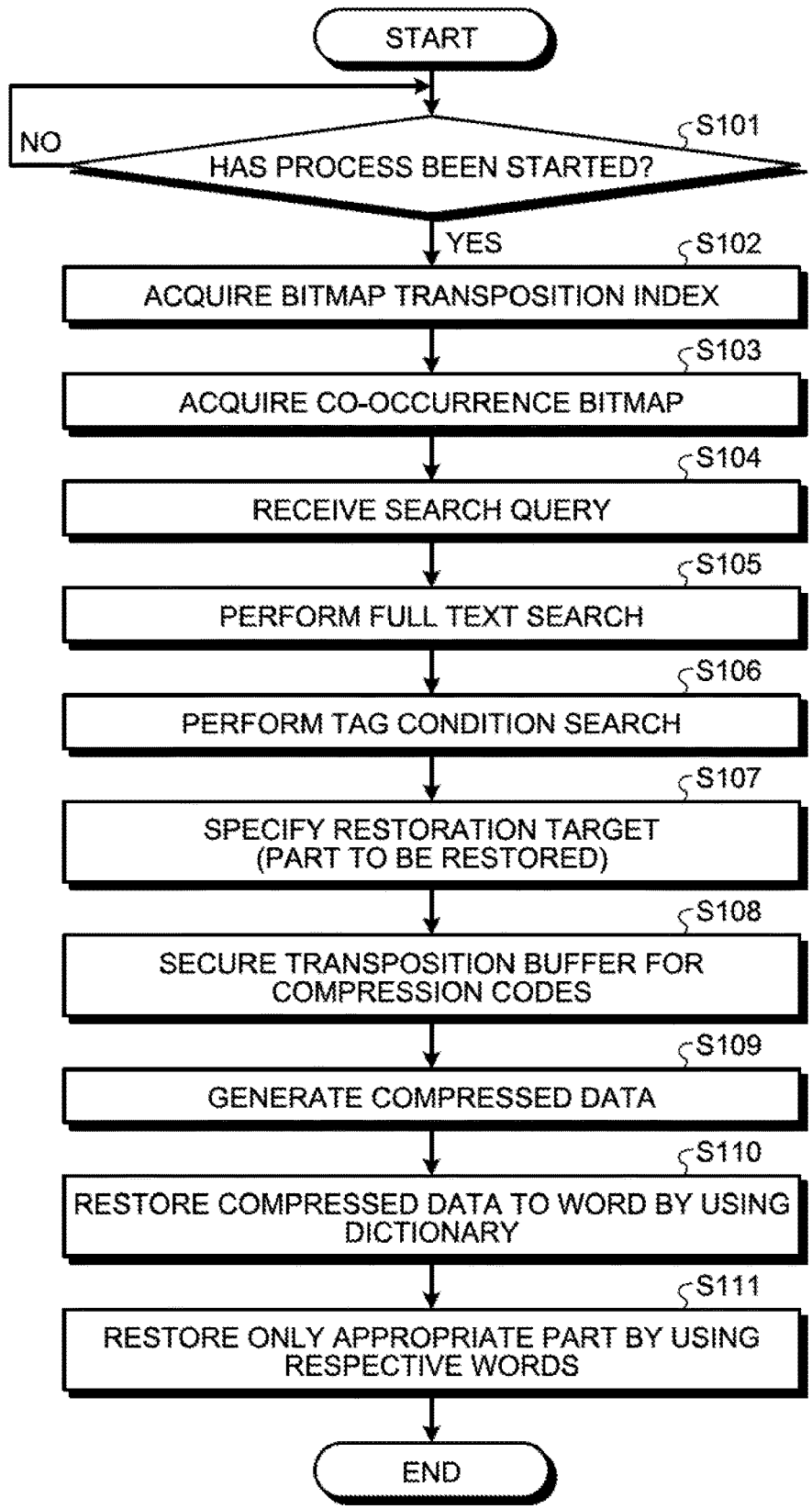
FIG. 14 is a flowchart illustrating a process flow.

FIG. 14 is a flowchart illustrating a process flow. It is assumed here that a static dictionary and a dynamic dictionary have been already memorized in a memory unit.

As illustrated in FIG. 14, when start of processing is instructed (YES at S101), the acquisition unit 21 of the information processing device 10 acquires a bitmap transposition index for each word (S102). The acquisition unit 21 also acquires a co-occurrence bitmap for each tag (S103). When respective bitmap transposition indexes have been hashed to reduce the size thereof, the restoration unit 22 restores the bitmap transposition indexes to the original size.

Subsequently, upon reception of a search query including tags and words to be searched from a user terminal or the like (S104), the search unit 23 performs full text search (S105) and performs tag condition search (S106) to specify that a search target in the search query is included in an original document and to specify a part of the original document, which is a restoration target (S107).

Subsequently, the transposition processing unit 24 secures a transposition buffer for compression codes (S108). The restoration processing unit 25 then uses bitmaps respectively corresponding to specified words and tags to specify the compression codes to be restored, and stores the specified compression codes at corresponding positions in the transposition buffer, thereby generating compressed data by deleting NULL (S109).

Thereafter, the restoration processing unit 25 restores the respective compression codes in the compressed data to words and the like (S110) by using respective dictionaries, and restores only the corresponding part by using the restored words and the like (S111).

Effects

As described above, the information processing device 10 performs transposition and replacement of compression codes and restoration of texts based on a bitmap transposition index with offsets and a co-occurrence bitmap. Specifically, the information processing device 10 associates one bit in a bit string of the bitmap transposition index with offsets with fixed three bytes in a byte string of the compression code, and performs transposition of a compression code of the corresponding word only for a part to be restored (tag-related part). Subsequently, the information processing device 10 suppresses NULL bytes in the respective compression codes. Thereafter, the information processing device 10 restores only a tag-related part to be restored by using the static dictionary and the dynamic dictionary based on a byte string of the compression code having the fixed three bytes. Therefore, the information processing device 10 can accelerate restoration by narrowing down only the part to be restored (tag-related part) based on the co-occurrence bitmap.

Second Embodiment

While an embodiment of the present invention has been described above, the present invention can be also carried out in various different modes other than the embodiment described above. Therefore, a different embodiment is described below.

Search Target

The information processing device 10 according to the first embodiment can perform the searching process described above by receiving a word or a tag as a search query. Further, the tag specified in the search query can be processed by using a method similar to that of the first embodiment, with regard to both a start tag and an end tag or either one of these tags. The information processing device 10 can process not only tags but also columns in a similar manner, and can employ any morpheme so long as the morpheme co-occurs.

Further, in the first embodiment, an example in which "HATSU" and "NETSU" are separately encoded has been explained. However, the present invention is not limited thereto, and encoding as "HATSUNETSU" is also possible. The compression codes explained in the embodiment are only an example, and do not limit their values and the like. Further, the relationship between a morpheme such as a word and a tag and a compression code is also only an example, and does not limit its value and the like.

Further, elements such as bitmap indexes, co-occurrence bitmaps, and the co-occurrence information DB 16 can be generated by the information processing device 10, and can be generated by the index generation device and the information processing device 10 can acquire these elements from the index generation device.

System

Process procedures, control procedures, specific names, and information including various kinds of data and parameters described in the above embodiments and illustrated in the drawings can be arbitrarily changed unless otherwise specified.

Further, the respective constituent elements of the respective devices illustrated in the drawings are functionally conceptual, and these constituent elements do not need to be configured in physically the same manner in the drawings. That is, the specific mode of distribution and integration of the respective devices is not limited to the illustrated ones.

In other words, all or a part thereof can be functionally or physically distributed or integrated in an arbitrary unit according to various kinds of load and the status of use. In addition, all or an arbitrary part of respective processing functions executed by the respective devices can be realized by a CPU (Central Processing Unit) and by a program analyzed and executed in the CPU, or can be realized as hardware by a wired logic.

Hardware Configuration

Figure 15:
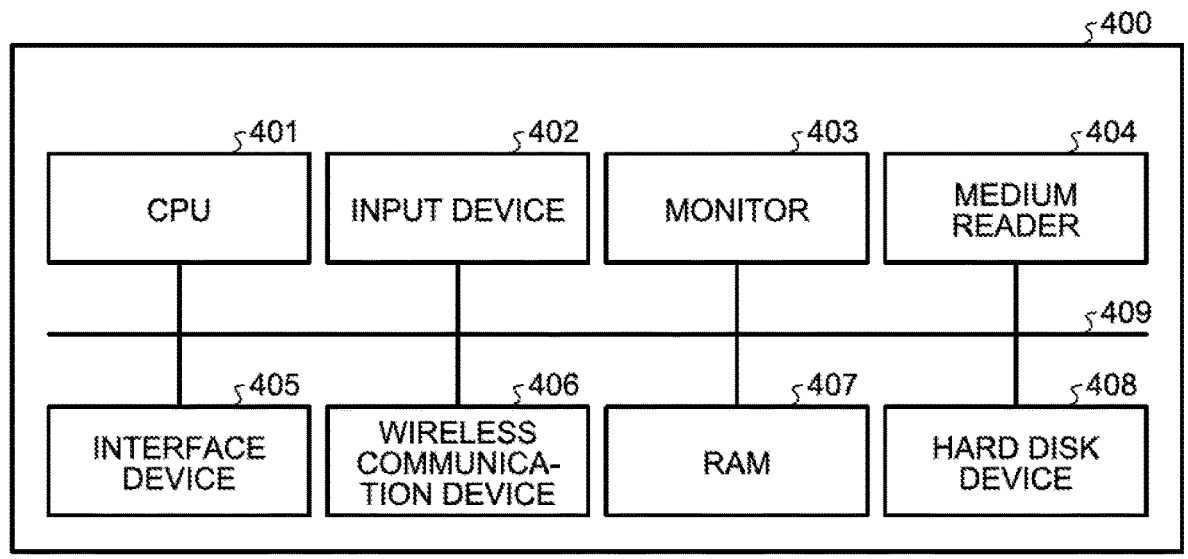
FIG. 15 is a diagram illustrating a hardware configuration of the information processing device according to the first embodiment.

FIG. 15 is a diagram illustrating a hardware configuration of the information processing device 10 according to the first embodiment. As illustrated in the example of FIG. 15, a computer 400 includes a CPU 401 that performs various types of arithmetic processing, an input device 402 that receives data input from a user, and a monitor 403. The computer 400 also includes a medium reader 404 that reads programs and the like from a storage medium, an interface device 405 that connects the computer 400 with other devices, and a wireless communication device 406 that wirelessly connects the computer 400 with other devices. The computer 400 also includes a RAM (Random Access Memory) 407 that temporarily memorizes therein various pieces of information, and a hard disk device 408. The respective devices 401 to 408 are connected to a bus 409.

An information processing program having the same functions as those of the respective processing units such as the acquisition unit 21 and the restoration unit 22 illustrated in FIG. 2, for example, is memorized in the hard disk device 408. Further, various types of data for realizing the information processing program are memorized in the hard disk device 408.

The CPU 401 performs various types of processing by reading out respective programs memorized in the hard disk device 408 and loading the programs in the RAM 407 to execute the programs. These programs can cause the computer 400 to function as the acquisition unit 21 and the restoration unit 22 illustrated in FIG. 2, for example.

The information processing program described above does not need to be memorized in the hard disk device 408. For example, it is possible to configure that the computer 400 reads and executes the program memorized in a storage medium that can be read by the computer 400. The storage medium that can be read by the computer 400 corresponds to, for example, a portable recording medium such as a CD-ROM (Compact Disc Read only memory), a DVD, and a USB (Universal Serial Bus) memory, a semiconductor memory such as a flash memory, or a hard disk drive. Further, it is possible to configure that the program is memorized in a device connected to a public line, the Internet, or a LAN (Local Area Network) and the computer 400 reads out the program from them to execute the program.

Figure 16:
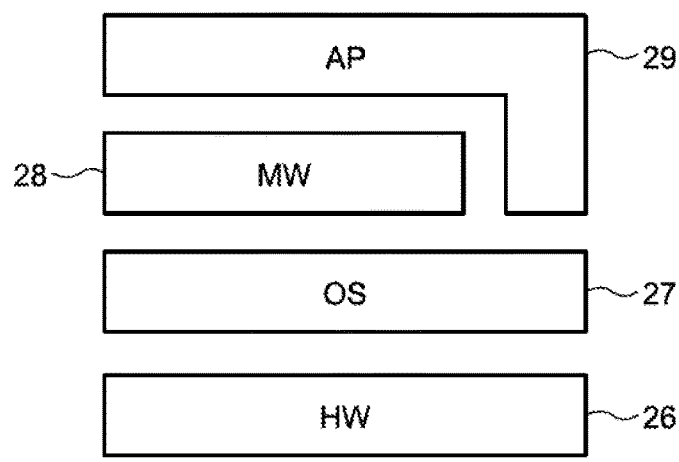
FIG. 16 is a diagram illustrating a configuration example of a program that is operated on a computer.

FIG. 16 is a diagram illustrating a configuration example of a program that is operated on the computer 400. In the computer 400, an OS (operating system) 27 that controls a hardware group 26 (401 to 409) illustrated in FIG. 15 is operated. As the CPU 401 is operated with a procedure according to the OS 27 to execute control and management of the hardware group 26, processing according to an application program 29 and middleware 28 is performed by the hardware group 26. Further, in the computer 400, the middleware 28 or the application program 29 is read to the RAM 407 and executed by the CPU 401.

When the search function is invoked by the CPU 401, by performing processing based on at least a part of the middleware 28 or the application program 29 (performing the processing by controlling the hardware group 26 based on the OS 27), the functions of the acquisition unit 21 and the restoration unit 22 are realized. The respective functions of the acquisition unit 21 and the restoration unit 22 can be respectively included in the application program 29 itself or can be a part of the middleware 28 that is invoked and executed according to the application program 29.

Figure 17:
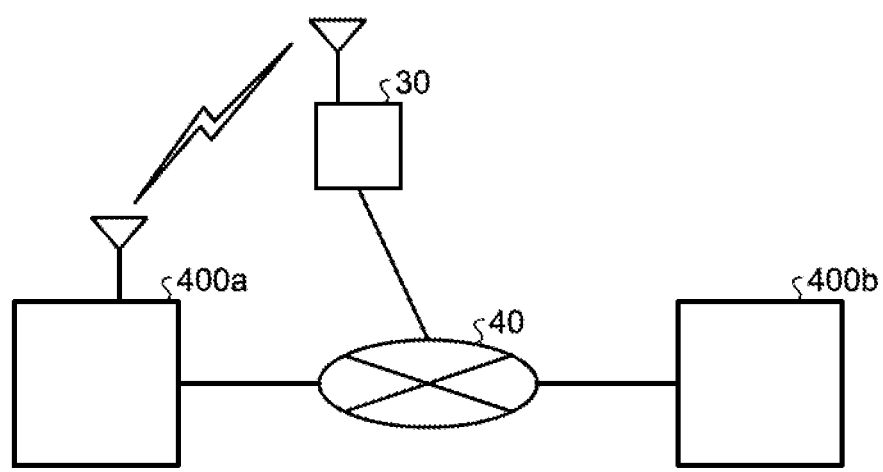
FIG. 17 is a diagram illustrating a configuration example of a device in a system according to a second embodiment.

FIG. 17 is a diagram illustrating a configuration example of a device in a system according to a second embodiment. The system illustrated in FIG. 17 includes a computer 400a, a computer 400b, a base station 30, and a network 40. The computer 400a is connected to the network 40, to which the computer 400b is connected in at least one of wired or wireless manner.

According to one embodiment, it is possible to restore original data and to shorten the time taken for the restoration.

All examples and conditional language recited herein are intended for pedagogical purposes of aiding the reader in understanding the invention and the concepts contributed by the inventors to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A non-transitory computer-readable recording medium storing therein a data generation program that causes a computer to execute a process comprising:

arranging in a buffer a first morpheme in an order of a position of the first morpheme in text data including morphemes, according to a position indicated in an index generated from the text data, the index including positions of the morphemes in the text data being respectively associated with each of the morphemes; and referring to relationship information indicating a relationship between morphemes in the text data, and with the first morpheme being a specific type that is a tag or a column and having a relationship with a second morpheme, arranging in the buffer the second morpheme in an order of a position of the second morpheme in the text data according to the position indicated in the index.

2. The non-transitory computer-readable recording medium according to claim 1, wherein the text data is coded into coded text data, the first morpheme is coded into a coded first morpheme, the second morpheme is coded into a coded second morpheme, the index associates coded morphemes included in the coded text data with positions thereof in the coded text data, and wherein the process further includes:

specifying positions of the coded first morpheme and the coded second morpheme in the coded text data, by referring to the index; and arranging in the buffer the coded first morpheme and the coded second morpheme according to the specified positions to restore the first morpheme and the second morpheme therefrom.

3. The non-transitory computer-readable recording medium according to claim 2, the process further including:

when a word and a tag, or a word and a column, are received as a search target and as morphemes in the coded text data, specifying positions of a first code that is a code of the word and a second code that is a code of the tag or the column in the coded text data by referring to the index; and arranging in the buffer the first code and the second code according to the specified positions to restore the word and the tag or column therefrom.

4. A data generation method comprising:

arranging in a buffer a first morpheme in an order of a position of the first morpheme in text data including morphemes, according to a position indicated in an index generated from the text data, the index including positions of the morphemes in the text data being respectively associated with each of the morphemes, by a processor; and referring to relationship information indicating a relationship between morphemes in the text data, and with the first morpheme being a specific type that is a tag or a column and having a relationship with a second morpheme, arranging in the buffer the second morpheme in an order of a position of the second morpheme in the text data according to the position indicated in the index, by the processor.

5. An information processing device comprising:

a processor configured to:

arrange in a buffer a first morpheme in an order of a position of the first morpheme in text data including morphemes, according to a position indicated in an index generated from the text data, the index positions of the morphemes in the text data being respectively associated with each of the morphemes; and refer to relationship information indicating a relationship between morphemes in the text data, and with the first morpheme being a specific type that is a tag or column and having a relationship with a second morpheme, arrange in the buffer the second morpheme in an order of a position of the second morpheme in the text data according to the position indicated in the index.

* * * * *